United States Patent [19]

McCoy et al.

[11] Patent Number: 4,884,335
[45] Date of Patent: Dec. 5, 1989

[54] SURFACE MOUNT COMPATIBLE CONNECTOR SYSTEM WITH SOLDER STRIP AND MOUNTING CONNECTOR TO PCB

[75] Inventors: Michael J. McCoy, Lyndhurst; John E. Hartman; John L. Wesbster, both of Painesville, all of Ohio

[73] Assignee: Minnesota Mining and Manufacturing Company, Saint Paul, Minn.

[21] Appl. No.: 217,130

[22] Filed: Jun. 29, 1988

Related U.S. Application Data

[63] Continuation of Ser. No. 12,191, Feb. 9, 1987, abandoned, which is a continuation-in-part of Ser. No. 747,343, Jun. 21, 1985, Pat. No. 4,641,426, and Ser. No. 782,351, Oct. 1, 1985, Pat. No. 4,663,815.

[51] Int. Cl.$^4$ .............................................. H05K 3/34
[52] U.S. Cl. ................................... 29/839; 228/56.3; 228/180.1; 228/246; 439/83; 439/715; 439/876
[58] Field of Search .................. 29/839, 840; 228/56.3, 228/180.1, 246; 439/83, 715, 876

[56] References Cited

U.S. PATENT DOCUMENTS

| | | |
|---|---|---|
| 2,776,008 | 1/1957 | Soderman . |
| 3,396,894 | 8/1968 | Ellis ..................................... 228/56.3 |
| 3,462,540 | 8/1969 | Harris, Jr. et al. . |
| 3,568,554 | 3/1971 | Wiechec . |
| 3,591,922 | 7/1971 | Pardee et al. ................ 228/180.1 X |
| 3,604,836 | 9/1971 | Pierpont . |
| 3,744,129 | 7/1973 | Dewey, Jr. .................... 228/56.3 X |
| 3,778,532 | 11/1973 | Braden ........................ 228/56.3 X |
| 3,822,622 | 7/1974 | Smith et al. . |
| 3,834,015 | 9/1974 | Renzo . |
| 3,864,014 | 2/1975 | Lynch . |
| 3,905,665 | 9/1975 | Lynch et al. . |
| 3,932,934 | 1/1976 | Lynch et al. .................... 228/246 X |
| 4,050,621 | 9/1977 | Bouley . |
| 4,206,542 | 6/1980 | Reavill . |
| 4,216,350 | 8/1980 | Reid ............................... 228/56.3 X |
| 4,557,411 | 12/1985 | Farquharson et al. ............. 228/56.3 |

FOREIGN PATENT DOCUMENTS 54-4846 1/1979 Japan .
653838 12/1978 Switzerland .

OTHER PUBLICATIONS

IBM Technical Disclosure Bulletin, vol. 23, No. 2, Jul., 1980.
IBM Technical Disclosure Bulletin, vol. 26, No. 9, Feb., 1984.

*Primary Examiner*—Howard N. Goldberg
*Assistant Examiner*—Carl J. Arbes
*Attorney, Agent, or Firm*—Renner, Otto, Boisselle & Sklar

[57] ABSTRACT

An electrical component (21) for mechanical mounting and electrical connection with respect to plated through holes (34) of a printed circuit board (20) compatibly with a surface mount attaching process includes an electrically non-conducting body (30), plural generally elongate contacts (31) extending from the body for insertion into such plated through holes (34), and the component (21) having a strip of solder type material (33) for melting, for flow into respective plated through holes, and for re-solidifying mechanically and electrically to couple the component to such printed circuit board. The strip preferably encircles the contacts and has reduced cross section portions between adjacent contacts. Preferably the component is a connector, such as a header, and the contact pins or leads thereof provide an interface connection between the printed circuit board and a separate or portable connector. A method for attaching such an electrical component (21) to a printed circuit board (20) compatibly with surface mount attaching processes and apparatus (70; 98; 99; 102; 114, 126) to carry out such method, and a method for making the component with solder (33) coupled to such electrical component.

31 Claims, 3 Drawing Sheets

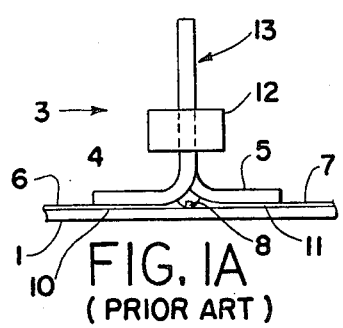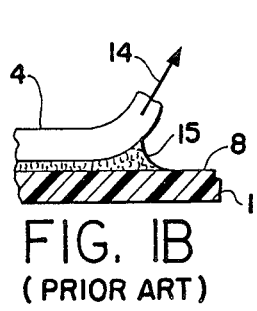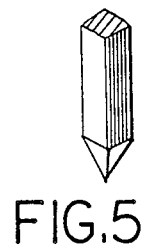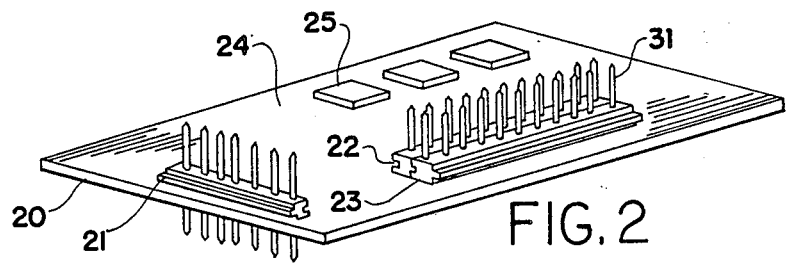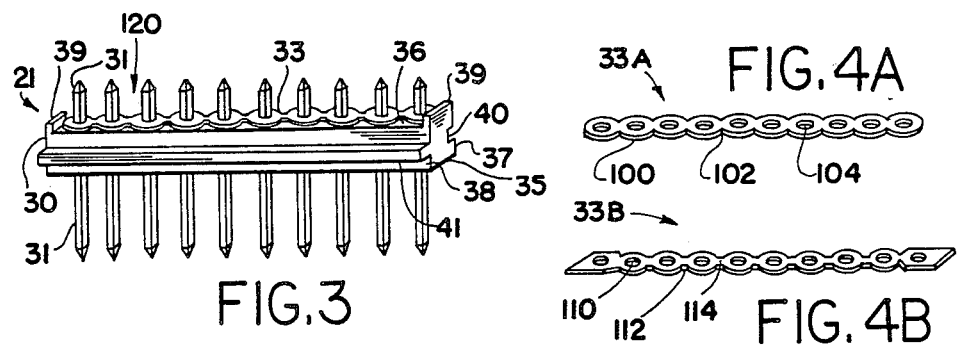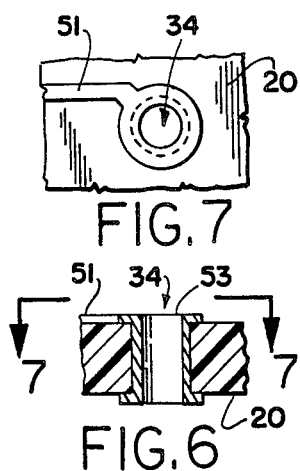

SURFACE MOUNT COMPATIBLE CONNECTOR SYSTEM WITH SOLDER STRIP AND MOUNTING CONNECTOR TO PCB

RELATED APPLICATION DATA

This application is a continuation of U.S. patent application Ser. No. 012,191, filed Feb. 9, 1987, now abandoned, which is a continuation-in-part of U.S. patent application Ser. No. 747,343, filed June 21, 1985, now U.S. Pat. No. 4,641,426, and Ser. No. 782,351, filed Oct. 1, 1985, now U.S. Pat. No. 4,665,815. The disclosures of such applications hereby are incorporated herein by reference.

This invention relates generally to surface mount electrical component/printed circuit board apparatus and processes and, more particularly, to electrical connectors compatible for use in the manufacturing and operation of surface mount apparatus.

BACKGROUND

Surface mount technology in the field of electronics is that in which electrical components are mounted directly to the surface of a printed circuit board or the like usually without any contacts or leads penetrating through the printed circuit board. Increased space utilization efficiency is an advantage of surface mount technology over space requirements of the prior art techniques for mounting electrical components with respect to a printed circuit board. Thus, surface mount technology provides increased density of components and/or increased capabilities for a given printed circuit board and the like; and surface mount technology also generally reduces the above board height requirements and, therefore, allows more printed circuit boards to be stacked or otherwise positioned in a given electrical apparatus.

In typical surface mount processes a surface mount electrical component is mounted directly to a printed circuit board. More specifically, the printed circuit board may have circuit traces and contact/mounting pads all printed on a surface thereof. A surface mount electrical component, such as a leaded chip carrier, an unleaded component, or the like, having plural leads, terminal pads, or the like, is placed on such contact/mounting pads. Solder may have been applied to such leads, terminal pads and/or contact/mounting pads prior to such placement. After all such components are placed on the printed circuit board, heat energy is applied to reflow the solder, such as vapor phase soldering, to complete electrical and mechanical connections between the component(s) and the contact/mounting pads and traces of the printed circuit board. Sometimes an adhesive material is used temporarily to hold the component(s) in position on the printed circuit board prior to and during such soldering.

Consistent with the surface mounting processes currently employed, electrical connectors have been mounted directly to the surface of the printed circuit board in substantially the same way as the other surface mount components are mounted, as is summarized above. In this way complete compatibility of mounting processes is achieved. An example of such an electrical connector is a device known as a header, which is a plurality of electrical contacts retained in relative position by an electrically non-conductive body. Typically such contacts are elongate pin type contacts with ends that are exposed at opposite sides, e.g., the top and bottom, of the body. The exposed contact ends remote from the body are of a shape and are so positioned to fit into electrical and mechanical engagement with the contacts of a portable connector which may be inserted over such contact ends. Such a portable connector may be a female connector having plural female contacts for engaging the male contacts of the header to provide electrical connection of respective circuits, e.g., to the conductors of a cable, another printed circuit board or the like. One or more headers may be mounted in side-by-side fashion to provide multiple rows of exposed header contacts for connection to the contacts of appropriately designed portable connectors and the like.

For consistency with surface mount processes one practice has been to bend the exposed ends of the connector e.g., header, contacts that are proximate the printed circuit board so that such contact ends can lay flat against the contact/mounting pads of the printed circuit board. Then, during the surface mounting soldering process, securement of those contact ends mechanically and electrically to the surface of the printed circuit board is accomplished in the same way that securement of the other surface mount components is accomplished.

However, such connector surface mounting process lacks certain strength and durability characteristics over prior through-the-board mounting techniques for mounting components on a printed circuit board. Specifically, whenever a portable connector is removed from the header/connector, a substantial force is applied to the connection of the contacts and pads to which they are attached; indeed, such pads themselves are not integral with the printed circuit board but are only an additional layer applied thereto. Thus, there is the possibility that the connection of the header to the printed circuit board and/or the integrity of the pads and printed circuit traces will be too easily damaged or destroyed when mechanically stressed by removing a portable connector from connection with the header connector.

Another disadvantage with the technique of using bent contacts to make connections between a connector mounted on a surface mount printed circuit board and the contact/terminal pads of the latter is the relatively large amount of space required for such contacts and the connections thereof to the printed circuit board. Such space requirement is contrary to one of the important advantages of the surface mount technique vis-a-vis other electrical components designed specifically to be space efficient in the surface mounting process. The prior techniques of coating a lead, contact, or the like with solder, e.g., using a process of dipping the lead in solder, are not satisfactory to place an adequate amount of solder on the lead to achieve reflowing of the solder into a plated through hole so as to provide a secure mechanical and electrical connection of the lead, contact, etc. to the printed circuit board.

According to the disclosures of the above earlier filed applications, an electrical component that has plural elongate leads or contacts is mountable and/or mounted in a printed circuit board compatibly with surface mount processes by placing the leads or contacts in plated through holes of the printed circuit board and effecting soldering function contemporaneously with the soldering effected during the surface mount soldering process. The leads or contacts in the holes increase the mechanical strength of attachment of the component to the printed circuit boar. The solder itself may be, for example, an adequate amount of solder paste or solder donuts applied to the contacts of the electrical component before it is placed in the printed circuit board. Retention of the solder with respect to the contacts of the electrical component may be facilitated and/or secured by a means integral with the component, such as a reservoir arrangement in the body of the electrical component. Moreover, the solder may be re-flowed to make secure mechanical and electrical connections of the electrical component contacts and respective plated through holes or other means of the printed circuit board to which attachment is intended at the same time that other surface mount components are connected by re-flowing solder, e.g. as in a vapor phase soldering or other soldering process. Methods and use of robotics or other automated equipment also are disclosed in such applications.

BRIEF SUMMARY OF INVENTION

The present invention will be described herein with respect to one exemplary electrical component, namely a header that permits other portable connectors or the like to be connected and/or removed with respect to the header. However, it will be appreciated that the principles of the invention may be used with other types of electrical components, connectors or the like. Exemplary other components include integrated circuits, chip carriers, gate arrays, sockets, various connectors, and the like, and generally electrical or electronic components or devices that are intended to be attached mechanically and electrically to a printed circuit board or the like. Moreover, the invention will be described with respect to the placement and connection of the header in plated through holes of a printed circuit board. However, it will be appreciated that the header may be placed in holes whether or not plated through) of a device other than a printed circuit board consistent with the invention; also the header may be connected with respect to such a printed circuit board by connection to other than plated through holes thereof, e.g. in holes that are not plated through. However, according to the preferred embodiment, the header contacts preferably are connected to plated through holes and terminal pads of a printed circuit board.

Briefly, according to one aspect of the present invention, a substantially continuous solder strip or the like is provided via an electrical connector, component, or the like that has contacts in such a relation that the solder can be re-flowed in a way that is compatible with surface mount technology to secure connection of a plurality of such contacts with a printed circuit board or the like. Hereinafter, for convenience and facility of description, the component of the invention will be referred to as a particular type of connector, namely a header, and that to which the header is connected or is intended to be connected will be referred to as a printed circuit board.

Use of such a solder strip facilitates installation of the solder strip on the contacts of the electrical component and/or retention of such strip on the electrical component.

The header itself preferably has a plurality of pin type contacts held in relative position for use by an electrically non-conductive strain relief body. According to the preferred embodiment and best mode, the strain relief body is made by plastic injection molding technique directly molding the body to the contacts.

According to another aspect, a header for mechanical mounting and electrical connection with respect to electrically conductive means of a printed circuit board or the like compatibly with a surface mount process includes an electrically non-conducting body, plural contacts extending from the body for electrical connection with respect to such electrically conductive means, and a substantially continuous solder strip extending between a plurality of the contacts.

One preferred form of header according to the invention is that known as a shrouded header or shrouded plug. Such shrouded header has plural pin-like contacts supported by a strain relief body. The strain relief body has a shroud which is generally coextensive with portions of the contacts at one side of the strain relief body for the usual guidance, protection and/or like purposes.

According to a further aspect, a method of attaching a header that has contacts with respect to a printed circuit board compatibly with surface mount techniques, includes the re-flowing of solder provided in a strip-like form that extends between the contacts such that substantially discrete connections of the contacts with respective conductive means of the printed circuit board are made.

In one embodiment the electrical component is a header having plural elongate parallel pin type contacts held in an electrically non-conductive body. The pins are inserted through plated through holes in the printed circuit board, e.g., manually, semiautomatically, fully automatically, using robotics, etc., while leaving some space between respective pins and hole walls. The solder strip provides a supply of solder type material about each pin and is meltable to fill up space left in each hole thus providing both mechanical securement and electrical connection between the contacts and the holes.

The solder strip preferably is configured to facilitate the melted solder flowing into plated through holes of the printed circuit board and along the pin contacts of the header without forming any undesirable bridges that would cause a short circuit. In this regard the solder strip may be chain-like having individual links all in a common plane to fit on respective pin contacts of the header but having relatively narrow connection portions between links as compared to the larger exterior diameter of the respective links. The solder strip may be formed by stamping the same from a strip of solder material to cut holes of respective links and to cut the narrow portions between links. Alternatively, the solder strip may be more strip-like rather than chain-like. In the strip-like version the solder strip is generally rectangular in plan view with openings cut for receiving the pin contacts and with nick-like cut outs between adjacent openings. The reduced area of the solder strips of the invention between adjacent openings is believed to help assure that solder will flow, partly by capillary action, to and into respective plated through holes and will not form undesirable bridges.

The header may include a reservoir-like means which may be formed by respective pairs of protrusions, such as stand off protrusions, of the header body that prevent the main part of the body from directly engaging the surface of the printed circuit board and/or provide other functions, as is described further below. Such protrusions and/or other means may cooperate with the solder strip of the invention to retain the solder strip in place during storage of the header, during insertion of the contacts of the header into a printed circuit board, and/or prior to re-flowing. Moreover, the cooperative interaction of the header pin contacts with the solder strip (e.g. relying on frictional interference) due to placement of the pin contacts into the openings of the solder strip may be adequate to hold the solder strip on the header to provide a reservoir function. Also, a reservoir function may be provided by a recess in the body of strain relief material with wall portions about the recess. The solder, e.g., in strip form, may be placed in such recess in engagement with such wall portions. An interference fit of the solder with the walls holds the solder in place. Two or more of the aforementioned and/or other reservoir functions may be employed to hold the solder on the header so the header may be stored and importantly placed for use in a surface mount compatible process, as is described herein. The mechanical and electrical integrity of such connector/printed circuit board connection ordinarily is at least as good and preferably better than is achieved using the prior bent contact surface mount attachment technique summarized above; and the technique of the invention also minimizes the amount of space required on the printed circuit board for attaching the header connector thereto. Furthermore, since there is no need for bent contacts, the additional height above board requirement therefor is eliminated, this being further consistent with the philosophy of surface mount technology.

According to still another aspect of the invention, a method of manufacturing an electrical component including an electrically non-conducting body, plural generally elongate contacts extending from the body for insertion into plated through holes in a printed circuit board, and solder type material for melting for flow into respective plated through holes and for re-solidifying mechanically and electrically to couple the component to such printed circuit board, comprises the step of pushing a strip of solder type material along respective contacts for retention thereon. According to a more preferred apparatus and method, solder cord is flattened to form a generally flat solder ribbon which has holes punched or cut therein at the same center-to-center spacing as the contacts in the component body, such holes being sized to closely receive the contacts therein, and also having nicks punched or cut therein to provide relatively thin cross sectional areas between the areas thereof intended to encircle the contacts.

These and other aspects, features, objects and advantages of the present invention will become more apparent as the following description proceeds.

To the accomplishment of the foregoing and related ends, the invention, then, comprises the features herein described and particularly pointed out in the claims, the following description and the annexed drawings setting forth in detail a certain illustrative embodiment of the invention, this being indicative, however, of but one of the various ways in which the principles of the invention may be suitably employed.

BRIEF DESCRIPTION OF THE DRAWINGS

In the annexed drawings:

FIGS. 1A and 1B are views of a prior art surface mounted connector on a printed circuit board respectively depicting a header so mounted and an enlargement of one of the header's bent contacts showing the forces applied during removal of a portable connector;

FIG. 2 is an isometric view of a printed circuit board with electrical components in the form of headers mounted thereon in accordance with the present invention with other surface mount components--the stand offs on the header bodies are not shown in this figure for facility and clarity;

FIG. 3 is a bottom isometric view of a header connector component with a solder strip in accordance with the present invention;

FIGS. 4A and 4B are, respectively, isometric views of chain-like and nicked strip-like solder strips according to the invention;

FIG. 5 is an enlarged fragmentary isometric view of a pin contact of the header connector component in accordance with the present invention;

FIG. 6 is an enlarged fragmentary section view of a plated through hole of the printed circuit board of FIG. 2;

FIG. 7 is a top view of the plated through hole of FIG. 6 looking generally in the direction of the arrows 7—7 of FIG. 6;

FIG. 8 is an enlarged fragmentary section view of the header positioned in a plated through hole in the printed circuit board prior to soldering;

FIG. 9 is an enlarged fragmentary section view of the header positioned in the printed circuit board after soldering;

DESCRIPTION OF THE PRIOR ART

Figure 10:
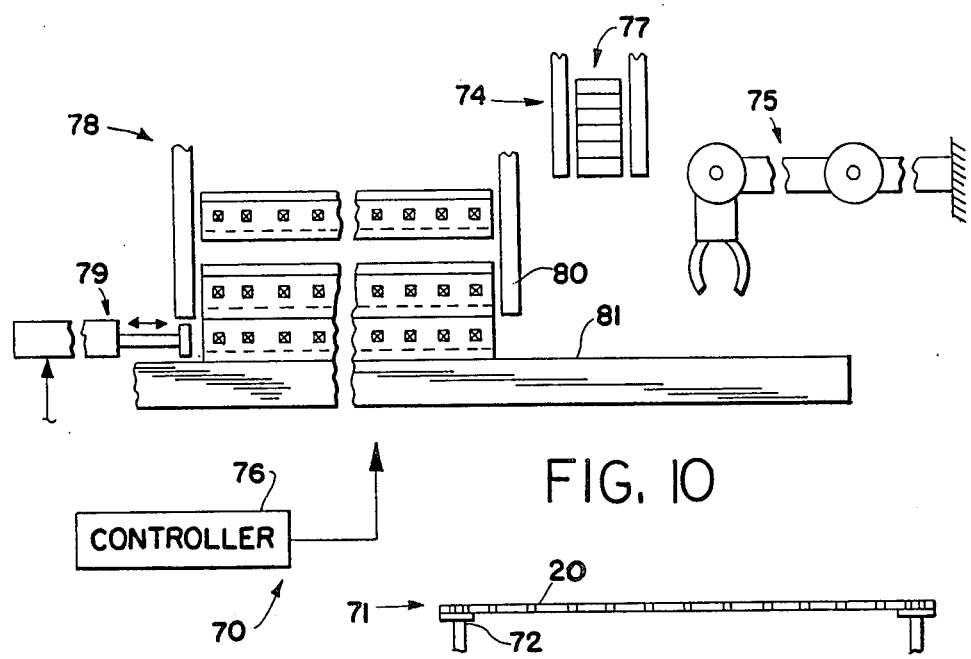
FIG. 10 is a schematic view of an automated machine for placing surface mount components in a printed circuit board.

Briefly referring to FIGS. 1A and 1B, a printed circuit face mount components are to be mounted board 1 on which surface mount components are to be mounted and an electrical connector 2 in the form of a header 3 with bent contacts 4, 5 are to be mounted is illustrated. The printed circuit board 1 has plural printed circuit traces 6, 7 printed or otherwise formed on the surface 8 thereof, each preferably having one or more mounting pads 10, 11, sometimes called solder pads, electrically connected therewith and on which a surface mount component may be mounted and electrically connected. The header 3 is formed of a body 12 of electrically non-conductive material that preferably is molded about a portion of each of the contacts 4, 5 to hold the same in the parallel alignment shown at available contacting portions 13 while also maintaining the bent contact ends 4, 5 in position to be attached to respective pads 10, 11.

With the header 3 in position on the printed circuit board 1 the header and other surface mount components may be vapor phase or otherwise soldered in place. The relatively large amount of space required by the contacts 4, 5 on the surface 8 of the printed circuit board 1 is evident from FIGS. IA and IB; to avoid breaking the contacts 4, 5 it is necessary that the curvature thereof be somewhat gradual and, therefore, more space consuming. In FIG. 1B the force applied to the contact 4 of the header 3 is represented generally by the vector 14 which can be resolved to a substantial vertical force concentration that tends to tear at the solder 15 in a direction in which there is a weakness in the solder, e.g. the solder is thin and there is minimal grasping force of the contact 4 in such direction, and in the pad 10 and a horizontal force component. Indeed, such tearing action can too easily damage the integrity of the connection between the contact 4 and the pad 10 and possibly also can damage the integrity of the pad vis-a-vis connection to the surface 8.

DESCRIPTION OF THE PREFERRED EMBODIMENT

Referring now in detail to the drawings showing the invention wherein like numerals designate like parts in the several figures and initially to FIG. 2, a printed circuit board 20 having a single header 21 and a pair of parallel headers 22 and 23 mounted thereon is illustrated. Also mounted on the printed circuit board surface 24 are several surface mount electrical components 25, such as leaded or unleaded chip carriers, etc.

The fundamental components of the invention, such as of an electrical component in the form of the header 21, include an electrically non-conductive body 30, one and preferably a plurality of electrical leads 31 in the form of pin type contacts supported by or protruding from such body, and a quantity of solder or solder type material 33, all of which are illustrated in FIGS. 3 and 4. The solder material is in the form of a solder strip. Preferably the header contacts 31 are insertable into and connectable by re-flowed solder to respective plated through holes 34 (FIG. 6) of the printed circuit board 20.

As is shown in FIG. 3, the body 30 is of electrically non-conductive material capable of withstanding the temperatures and other environmental conditions experienced during the process by which the surface mount components are secured to the printed circuit board, e.g., during a vapor phase soldering process, etc. Such temperatures and environmental conditions may be more severe than those experienced in the past using conventional wave soldering techniques wherein the heat of the solder wave usually is kept remotely from the components, i.e. on the opposite side of the printed circuit board from the component.

Preferably the body 30 is of rectangular cross section having top and bottom surfaces 35 and 36 through which the leads, in the form of pin contacts 31, protrude or extend, and side surfaces 37 and 38. At the bottom surface 36 the solder supply 33 is retained. Body 30 may include a pair or more than a pair of stand off protrusions 39 that extend from the surface 36. The stand off protrusions 39 may provide a reservoir function to help retain the solder strip 33 with respect to the header body 30 by engagement with the solder strip, e.g., the solder strip being cut slightly longer than the distance between a pair of protrusions so as to be forced against a protrusion and held in place by compression and/or frictional forces.

To facilitate automated handling of the headers 21, 22 and 23 (FIG. 2) the side surfaces 37 and 38 preferably are of a shape that permits one surface to slide along the other. More specifically, the surfaces 37 and 38 are generally smooth except for a groove 40 formed in the surface 37 and a flange, tab or tongue 41 formed in the surface 38. The tab of one header may slide in the groove of an adjacent one to facilitate the mentioned automated handling, as is described further below. Such tab and groove arrangement also may help to secure the two headers 22 and 23 (FIG. 2) with respect to each other to reinforce their retention on the printed circuit board 20.

The pin contacts 31 preferably are elongate, most preferably they are straight, although special curvature at appropriate locations may be included, if desired, for example to help retain the same in the body 30 or for other mechanical or electrical connection purpose. The pin contacts 31 extend beyond the top of the header body 30 a distance and direction adequate to facilitate secure attachment to respective female contacts or the like thereto, and the pin contacts 31 extend beyond the bottom of the header an adequate distance to pass through the plated through holes 34. The cross section of the pin contacts or leads 31 may be rectangular, for example square; alternatively, they may be generally circular. A rectangular cross section, though, ordinarily provides greater strength than round cross section.

As it is seen in FIG. 4A, the solder strip 33A is chain-like. That is, the solder strip 33A has plural circular link portions that are similar to the solder donuts disclosed in the second-filed above-mentioned application. However, such links 100 are interconnected by connecting portions 102 that have a narrower cross sectional length across the axis of the solder strip 33A in the plane of the donuts than the diameter of the donuts in the illustrated major plane thereof. Moreover, the donuts or links 100 have openings 104 into and through which pin contacts 31 may be placed; such links are preferably in the same plane, as is illustrated in FIG. 4A. The chain-like solder strip 33A may be formed of a cord or generally flat strip of solder that is cut out to the shape shown or may be made by other available techniques. Such chain-like strips of solder have been used in the past, for example, to facilitate soldering on the back planes of wire wrap panels.

In the other version of solder strip 33, as is viewed in FIG. 4B, the solder strip is in the form of a nicked strip 33B. Such nicked solder strip 33B may be formed from a generally flat strip of solder with openings 110 cut in the same to receive the pin contacts of the header and with plural nicks 112 cut in the side walls thereof between the adjacent openings. The nicks provide the reduced size cross sectional area 114 between adjacent openings similar to the area of the connecting portions 102 of the chain-like strip 33A mentioned above.

It is believed that the connecting portions 102, 114 of the strips 33A, 33B help assure that when the solder is re-flowed the solder will flow along the pin contacts of the header and into the respective plated through holes without forming undesirable bridges that could cause a short circuit. Thus, for example, the narrow connecting portions 102, 114 tend to assure that the respective solder strip will form discrete pools of molten solder when heated above melting point. Desirably the parts of the solder strips 33A, 33B, e.g., the size of the nicks 112, diameters, thicknesses, etc., are substantially uniform in order to assure uniform solder flowing and connections during re-flowing. If desired, the solder material of respective solder strips may include flux material for usual purposes. Also, the solder strips may be formed of commercially available solder, such as paste resin acid core type solder or other types, if desired.

The stand off protrusions 39 of the header body preferably hold the header body adequately high above the surface of the printed circuit board 12 so that the solder 33 when melted will tend to flow down the pin contacts as individual pools thereof flowing down along a surface adhering thereto by surface tension considerations and also entering and following the plated through holes according to capillary action considerations. Thus, the likelihood of encountering a bridging problem or soldering to incorrect areas of the printed circuit board is minimized. Both to enhance the just-described function of the stand off protrusions and to help assure retention of the solder strip 33 with respect to the header body, the solder strip 33 preferably is at least substantially fully recessed in the header body below the projecting extent of the stand off protrusions 39; this arrangement also helps take advantage of the reservoir effect provided by and below the projecting surface level extent of the stand off protrusions. Therefore, as is seen in FIG. 3, for example, the stand off protrusions 39 preferably provide a reservoir 120 for the header to help retain the solder strip 33 therein.

If desired, the solder strip 33 may be retained on or in the header body using adhesive material.

Also, if desired, the interaction of the engagements of the header pin contacts with respect to the interior edges of the solder strip surrounding the respective openings 104, 110 through which the pin contacts pass may provide the support function to retain the solder strip 33 on the header; alternatively, the same may cooperate with one of the other retention features, e.g. reservoir and/or adhesive, to retain the solder strip on the header body. The openings 104, 110 in solder strips 33A, 33B may be fully encircled by solder, as is illustrated in the preferred embodiment. Alternatively, the openings 104, 110 may be partially surrounded by solder and, thus, be more like a curved recess in the solder strip that at least partly encircles a respective pin contact. In both cases, though, preferably the solder strip includes plural links or portions so as to encircle or partly to encircle plural pin contacts along at least part of the length and circumference of the respective contacts. Resulting from such arrangement are the advantageous characteristics of facilitating installation and retention of the solder on the header.

In FIGS. 6 and 7 the plated through holes 34 are shown. Such holes are through the printed circuit board 20, are plated, and preferably are coupled electrically to printed circuit traces 51 on the printed circuit board in usual manner. The relation of the cross sectional size or dimension of the plated through holes to that of the pin contacts is such that will minimize, indeed preferably will avoid any, insertion forces of the pin contacts 31 into the board 20 and facilitate pin to hole alignment during manufacturing, which may be particularly advantageous when using automated, e.g., robotic, manufacturing techniques. The noted cross sectional relation is such that there is at least some space between part of the faces 52 of the pin contacts 31 and the sides 53 of the holes. Such space 54 is provided to permit the flow of solder therein, e.g., when the solder type material 33 is reflowed during the surface mount process.

Placement of the header 21 in the printed circuit board 20 is shown in enlargement in FIGS. 8 and 9, the former before soldering and the latter afterwards. The bottom end of the pin contact 31 is shown inserted into the plated through hole 34 to such extent that preferably the solder strip 33 is in engagement with the printed circuit board top surface or with the plated through hole and/or adjacent trace printed thereon, but as indicated elsewhere herein the solder strip may be spaced away from the top surface of the printed circuit board. On one hand, the recessed area in the header body 30 between stand offs provides the reservoir 120 and allows a relatively large amount of solder, in any event the amount needed to complete a secure soldering process while permitting the body to be positioned rather close to the top surface of the printed circuit board to minimize height above board requirements and to maximize strength parameters. On the other hand, the stand offs provide space above board to permit cleaning of the board surface to remove residual flux from the solder surfaces. The open area between stand offs also may improve heat penetration to the solder strip to melt the same, and to assure melted solder flows to proper locations, i.e., down the hole and to form the desired meniscus 55 and meniscus 56, as is seen in FIG. 9, without causing any short circuiting to other pin contacts, printed circuit traces, etc.

The solder supply 33 may be an electronic solder paste, such as that sold by Alpha Metals Inc., Jersey City, N.J. Such solder paste may be cured in usual fashion, e.g, by heat, to prevent the same from being sticky and, thus, to facilitate shipping and handling and to extend shelf life. Such solder paste may be formed into the solder strip 33 described herein prior to installation on a header. The solder strip may be formed, for example, from electronic solder rope of the paste resin acid core type, or the like. Such material may be rolled generally flat as by passing the solder rope between a pair of spaced rollers to form a generally flat solder strip or ribbon. The solder ribbon, which may be about 0.015 inch thick and about 0.125 inch wide, may be placed on a punch and die apparatus to punch out the openings and nicks or other shape configurations desired, as are described herein. The solder strip thusly formed may be installed onto the pin contacts of a header or the like, as also is described herein.

Summarizing installation of the header 21 in the printed circuit board, the header pin contacts 31 are inserted into respective plated through holes. The solder strip 33 in the reservoir 120 is heated, melts and by capillary action, gravity, etc., flows into the space 54 and then solidifies.

In FIG. 9 the reflowed solder 57 can be seen filling the space 54 and also forming the meniscus 55 at the top of the printed circuit board and preferably also forming a further meniscus 56 at the bottom of the hole in the printed circuit board. Each meniscus helps to assure effective electrical connection, provides some degree of compliance factor as parts mechanically are bent, stressed, etc., and tends to maintain cleanliness of the areas where the majority of the pin contacts, plating in the plated through holes, and solder engaged with both of the latter are mechanically and electrically coupled. Preferably the quantity of the solder is adequate when reflowed to fill the space 54 and to form the menisci 55, 56 extending along the pin contact 31 beyond the plane of the board 20 at the top and bottom surfaces thereof for the aforementioned reasons, i.e., to achieve the above advantages of the invention. Too little solder may result in the space 54 not being filled and/or one or both of the menisci being too short or even recessed within the hole 34.

The aforementioned reflowing of the solder may be achieved using vapor phase soldering or other technique employed for surface mount electrical and mechanical attachment processes vis-a-vis surface mount electrical components and printed circuit boards or the like intended to carry the same.

An important advantage to the aforementioned solder supply 33 and reservoir 120 therefor is that since the solder material is provided in a reservoir on the connector or other electrical component, i.e., the header 21, rather than as a coating or layer on the pin contact or on the plating of the plated through hole, the possibility of scraping away the solder during insertion of the pin contact into the hole is avoided. Moreover, such reservoir of solder preferably permits adequate amount thereof to be carried for filling the space 54 for strength and integrity of the mechanical and electrical connections to be made.

An automated apparatus for assembling printed circuit boards with surface mount components is shown schematically at 70 in FIG. 10. Such machine includes a support 71 for a printed circuit board, with conventional alignment mechanism for placing, loading, and/or holding the board 20 in proper alignment. An exemplary support for the board 20 is shown at 72. The machine 70 also includes a supply 74 of surface mount components and/or other electrical and electronic components, a robotic mechanism 75, such as a robotic arm with appropriate movement and retention capabilities, and a controller 76. The controller 76 may be a computer control device of conventional design programmed in conventional manner to operate the supply 74 to provide surface mount components for pick up and delivery to the printed circuit board 20 by the robotic arm 75 and, of course, also to operate such arm. Such apparatus may be generally of the type that is employed in automated surface mount manufacturing processes, and operation of such apparatus may be generally as is conventional for such apparatus as used in surface mount manufacturing processes.

The supply 74 includes, for example, a supply of conventional surface mount components, such as PLCC (plastic leaded chip carrier) and/or other devices in a holder, all generally designated 77, and a further holder 78 for containing a supply of a plurality of headers 21 in stacked relation. Associated with the holder 78 is a pusher 79 for pushing a header 21 out from between guides 80 along a table 81 into position for pick up by the arm 75 both under operative control of the controller 76. Since the side surfaces of the header bodies 30 are smooth or in any event designed to slide over each other and especially in view of the tab 40 and groove 41 configuration thereof, such sliding in an accurately determined manner can be accomplished to facilitate use with and positioning by the automated apparatus 70. Thus, upon being picked up by the robotic arm 75, the header may be conveniently rotated by the arm and is placed properly in the plated through holes provided therefor in the printed circuit board 20.

Figure 11:
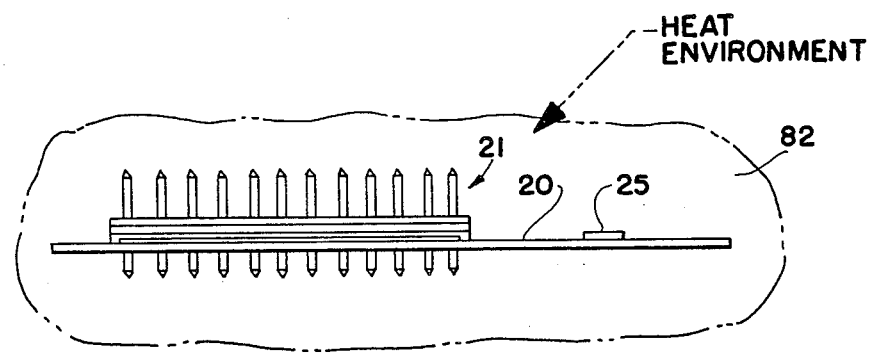
FIG. 11 is a schematic view of a vapor phase solder environment in which soldering of surface mount and connector components according to the invention may be carried out.

Briefly referring to FIG. 11, the assembled printed circuit board 20 with several surface mount electrical components, such as PLCC and header/connector devices, positioned thereon is shown placed in a heated environment 82 in which vapor phase soldering of such components and printed circuit board can be accomplished in conventional manner. During such soldering, solder already pre-placed on the printed circuit board and/or on the components (ordinarily except or the header or other components that are to be secured to the printed circuit board in the manner described in detail above with respect to the header 21) will be reflowed to complete mechanical and electrical connections. Also during such soldering the solder strip 33 will reflow in the manner described above to complete the connections shown in detail in FIG. 9. It will be appreciated that if desired there may be a pre-placement of solder at the plated through holes 34 and/or on the pin contacts 31 while realizing that some of such solder likely would be pushed out or scraped off when the pin contacts 31 are pushed into the holes. It also will be appreciated that other surface mount components may be mechanically and electrically connected to a printed circuit board in the manner described with respect to the header 21 while still maintaining the space efficiency aspects of surface mount technology and processes.

In view of the foregoing, it will be appreciated that the invention may be used to secure mechanically and electrically electrical components, such as connectors, more particularly headers, and the like to printed circuit boards or other surfaces or supports for such components in a way that is compatible with surface mount processes and while maintaining the space utilization efficiency offered by surface mount technology.

A method and apparatus for assembling the solder strip 33 on a header 20 generally is described in the above-mentioned earlier-filed applications; and such method and apparatus generally can be used in accordance with the present invention to install solder strips 33 on headers and also to make the solder strips, for example. Thus, the solder strip 33 may be slid along the pin contacts on one side of the header body and, if desired, press fit into a reservoir area 120 for retention on the header. Such press fitting may be done manually, semi-automatically or fully automatically.

Figure 12:
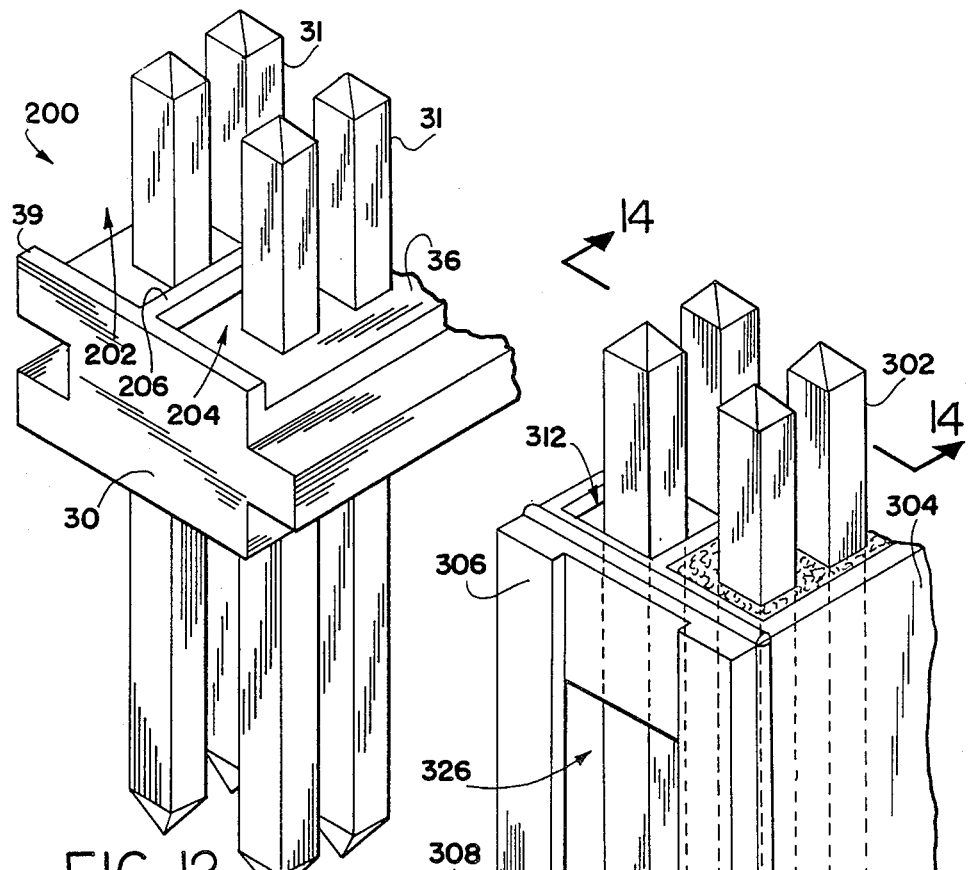
FIG. 12 is an isometric view similar to that of FIG. 3 showing another embodiment of header connector component according to the invention with a pair of contact rows and a separator rib or wall between the rows.

Briefly turning to FIG. 12, another embodiment of header 200 according to the invention is illustrated. The header 200 is similar to the header 21 except that the header 200 has two parallel rows 202, 204 of parallel aligned contacts 31. Also, separating the rows 202, 204 is a wall 206 that preferably is about the same height above, i.e. beyond, the bottom surface 36 of the header body 30 as the stand off protrusions 39. If desired, the stand off protrusions 39 may extend beyond the height of the wall 206 away from the bottom surface 36. The wall 206, therefore, provides a spacing function like that of the stand off protrusions 39 and also separates respective strips 33 of solder material that may be positioned on the contacts of the respective rows 202, 204 so that a separate strip is on each row of contacts. During the re-flowing of the solder of the plural strips, the wall 206 helps to assure that solder will not form a bridge between respective adjacent rows of contacts; rather the solder at respective pin contacts 31 will tend to flow down the respective contacts into respective plated through holes to make the desired secure mechanical and electrical connections desired with the plating in such holes and/or with the solder pads, mounting pads, terminal pads, or the like proximate such holes. The wall 206 also may cooperate with the stand off protrusions 39 and/or contacts 31 to bind the solder strip 33 in position on the header 21.

Thus, it will be appreciated that the present invention may be used with one or with plural rows or arrangements of electrical contacts in an electrical component, connector, header, or the like. In the several embodiments of the invention described herein, preferably the solder of the solder strip 33 encircles respective contacts generally fully about the circumference thereof along a generally planar cut normal to the axis of the contact; however, it will be appreciated that the principles of the invention also would inure to a design in which the solder strip provided only partial encirclement, e.g. providing semi-circular positioning with the openings in the solder strip thus being less completely surrounded by solder. As another alternate embodiment, the reservoir function of the header or like body 30 may be provided by a recess (see FIGS. 13 and 14) in the bottom surface of the header body in lieu of or in addition to reservoir function provided by the stand off protrusions 39, wall 206, or interference fit with the contacts 31. Further, although each solder strip 33 preferably encircles each of the contacts in a particular parallel positioned arrangement or row thereof, it will be appreciated that the solder strip may encircle less than all the contacts, enabling, for example, the ones not encircled, to be provided for in some other manner, such as cutting off the same, non-connection thereof to the printed circuit board, etc.

Figure 14:
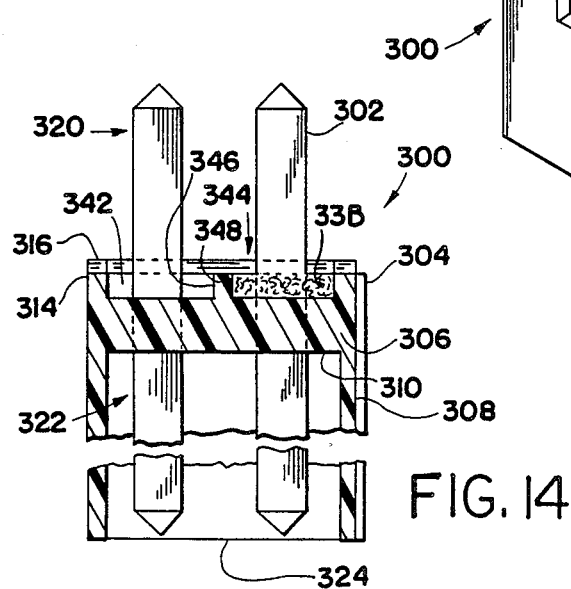
FIG. 14 is a section view of the shrouded header of FIG. 13 looking generally in the direction of the arrows 14—14 thereof.
Figure 13:
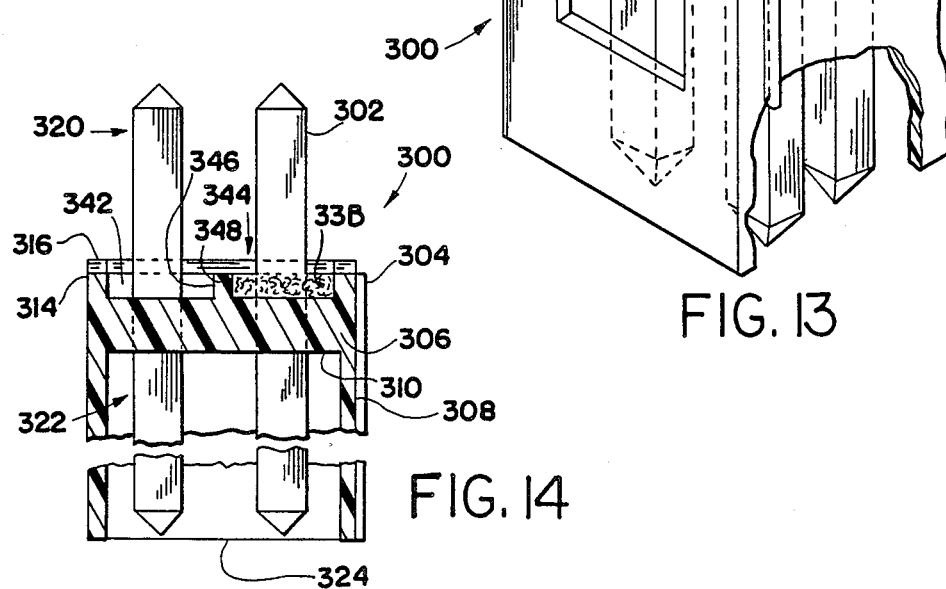
FIG. 13 is a fragmentary isometric view of a shrouded header according to the preferred embodiment of the invention with a solder strip shown in position in a recessed reservoir and on one of the two rows of contacts, the solder strip for the other reservoir and row of contacts being omitted for clarity of illustration and description.

Turning, now, to FIGS. 13 and 14, the preferred embodiment and best mode of the present invention is illustrated in the form of a shrouded header 300, sometimes also referred to in the field as a box header. The shrouded header 300 includes a plurality of pin contacts 302 that are secured in a strain relief body 304. For the illustrated embodiment, the contacts are straight pin type contacts; it will be appreciated that the contacts may be another type of contact. Also, it will be appreciated that although the pin contacts 302 are shown in a pair of parallel rows thereof, such contacts may be arranged in a single row or in more than two rows. The body 304 includes a base 306, a shroud 308 extending from the front or top surface 310 of the base, a reservoir 312 in the back or bottom surface 314 of the base, and plural stand off protrusions 316 at the bottom surface. Only one of the protrusions 316 is seen in FIGS. 13 and 14 due to the fragmentary nature of the drawing, but it will be appreciated from such figures and from the several embodiments disclosed that one or more additional stand off protrusions may be located generally along the length of the bottom surface 314 of the base 304 and, of course, that the number of contacts 302 in the header 300, the number of rows of such contacts, and the length of the header (along the length of respective rows of contacts thereof) may be selected, for example to any number or value, as may be desired.

The pin contacts 302 have back contact ends 320 intended to be placed in plated through holes of a printed circuit board and front contacting ends 322 intended to connect with the contacts of a portable connector or the like inserted with respect thereto, as is well known. The shroud 308 preferably is integral with the base 306 of the strain relief body 304 and forms a protective mechanism for the contacting ends 322 of the contacts 302 and a guide function to guide a portable connector into proper alignment and connection with respect to the pin contacts 302. To these ends, the shroud preferably is a wall that is located generally collectively about the contacting ends 322, and such shroud is open at the front end 324 to permit access to the contacts by such portable connector.

The body 304 preferably is molded directly to the contacts. Alternatively, the body 304 may be pre-formed, e.g., pre-molded; and subsequently the contacts may be inserted into respective openings or the like in the body for retention with respect thereto. As is illustrated, the shroud may include a window 326 at each end wall for receiving a conventional latch mechanism to couple more securely the header 300 and portable connector (not shown).

As is seen in the illustrated embodiment of FIGS. 13 and 14, the reservoir 312 is formed as a pair of recesses or grooves 342, 344 that extend generally along the length of the header 300 Each recess has a surrounding wall 346 that bounds the same on the sides thereof, and each recess is open at the back end 314 of the header body 304. A wall or rib 348 separates the respective recesses 342, 344. Preferably the interior surface of each recess is generally solid except for the area where the pin contacts 302 extend therethrough. A supply of solder, for example, in the form of a strip 33A, 33B, may be placed in the reservoir recesses. In FIGS. 13 and 14 a solder strip 33B is shown in place in the recess 344; but for illustrative purposes (more clearly to show the nature of the recesses) the recess 342 is shown before a solder strip has been placed therein. The solder strip (or other selected supply of solder) preferably is retained on the header 300 by physically engaging at least part of the wall 346 to effect an interference fit for frictional binding/retention of the solder strip in the respective recess. Such solder strip also or alternatively may effect an inteference fit with part of the contacts 302 over which it is placed to achieve the retention function. The stand off protrusions 316 also may cooperate with the solder strip 33B to bind against the same for retention on the header 300.

The amount of solder contained in the solder strip 33B, or other solder supply for the header 300, is adequate to be reflowed into the plated through holes in which the contact portions 320 have been positioned so as substantially to fill the space in the hole and to provide the menisci described above to achieve the secure electrical and mechanical connection of the header 300 to a printed circuit board. However, the amount of solder should not be so great as to encounter unintended short circuits, bridging, etc. The wall 348 separates the recesses 342, 344 and respective solder supplies, e.g. strips 33B, further to help avoid short circuits and bridging. Preferably the stand off protrusions 316 provide the above-mentioned stand off functions without interfering with the solder reflow process.

In view of the description hereof, it will be appreciated that the headers of the invention may be made by plastic injection molding or other techniques. The solder strips may be slid onto or perhaps otherwise placed with respect to the contacts so as preferably to be retained on the header. The contact portions 320 may be placed in plated through holes of a printed circuit board. Subsequently, by vapor phase or other solder reflow process that preferably is compatible with surface mount technology, such solder may be reflowed to form an electrical and mechanical connection having good integrity of the header (or other component) with the printed circuit board (or the like).

While various embodiments of the invention are described and illustrated herein, it will be appreciated that equivalent variations will come within the spirit of the invention. The following claims define the scope of the invention.

What is claimed is:

1. A method of manufacturing an electrical component including an electrically non-conducting body, plural generally elongate contacts extending from the body for insertion into plated through holes in a printed circuit board, and the component having at least one substantially continuous solder strip extending between and at least partly surrounding at least part of a plurality of such contacts, for melting, for flow into respective plated through holes, and for re-solidifying mechanically and electrically to couple the component to such printed circuit board, said method comprising the steps of placing such strip of solder type material simultaneously on a plurality of such contacts and pushing such strip of solder type material simultaneously along a plurality of such respective contacts and into relatively close proximity of such body.

2. The method of claim 1 further comprising the step of forming openings in such strip for receiving such contacts therein and forming reduced cross section areas in the strip between respective openings.

3. An electrical component for mechanical mounting and electrical connection with respect to electrically conductive means of a printed circuit board compatibly with a surface mount process, said component comprising:
   an electrically non-conducting body,
   plural contact means extending from said body for electrical connection with respect to such electrically conductive means,
   a substantially continuous solder strip extending between and at least partly surrounding at least part of a plurality of said contact means, and
   reservoir means for retaining said solder strip in said body.

4. The component of claim 3, said contact means comprising generally elongate contacts insertable into plated through holes in a printed circuit board.

5. The component of claim 3, said reservoir means comprising protrusion means extending from part of said body for receiving said solder strip in engagement therewith, and said solder strip having a length such that the same is under at least some compression force by said protrusion means to hold said solder strip in place with respect to said body.

6. The component of claim 5, said protrusion means comprising stand off means for holding at least part of said body away from the surface of a printed circuit board while said solder strip also is held at a spaced apart relation to such surface, whereby upon melting of said solder strip solder may flow along respective contact means into engagement with such electrically conductive means and may solidify thereby mechanically and electrically to couple the component to such electrically conductive means.

7. The component of claim 3, said solder strip including a strip of solder material and opening means in said strip to receive therein respective ones of said plural contact means while solder at least substantially completely encircles said respective ones of said plural contact means.

8. The component of claim 7, said solder strip comprising a chain-like strip having plural link elements arranged generally in a common plane and connecting portions between adjacent link elements connecting the latter, said connecting portions having a narrower dimension across the surface of said strip than the dimension of said link elements across the surface of said strip.

9. The component of claim 7, said strip of solder material further having a first relatively large dimension across the width thereof at the area of said opening means and having a second relatively smaller dimension across the width thereof at an area thereof between adjacent opening means.

10. The component of claim 9, said strip of solder material comprising an elongate strip of material having plural opening means therein spaced apart along the length thereof and said smaller dimension area comprising nick-like portions in the edges of the strip to reduce the effective width thereof at such areas.

11. The component of claim 3, said component comprising a header, said contact means comprising plural parallel positioned contacts held by said body to form said header.

12. The component of claim 3, said body having a surface from which said plural contact means extend for electrical connection with respect to such electrically conductive means, and said reservoir means including wall means protruding from said surface for defining a wall of said reservoir means.

13. The component of claim 12, said wall means including stand-off means for holding at least a part of said body away from the printed circuit board.

14. The component of claim 12, including two said wall means, and said solder strip being positioned between said two wall means and surrounding and extending between at least two of said plural contact means.

15. The component of claim 12, including stand-off means for holding said body with respect to the printed circuit board with the solder strip spaced away from the printed circuit board.

16. An electrical component for mechanical mounting and electrical connection with respect to electrically conductive means of a printed circuit board compatibly with a surface mount process, the electrically conductive means including plated through holes of the printed circuit board, said component comprising:
   an electrically non-conducting body,
   plural contact means extending from said body for electrical connection with respect to such electrically conductive means, said contact means comprising plural generally elongate contact means extending from said body for insertion into and locating of first parts thereof coextensively with such plated through holes, and said contact means also having second parts located above said first parts,
   a substantially continuous solder strip extending between and at least partly surrounding at least part of a plurality of said contact means, and
   means for retaining said solder strip generally coextensively with said second parts of said plural contact means for subsequent melting, flow into respective plated through holes, and re-solidifying mechanically to mount and electrically to connect said component to such printed circuit board.

17. The component of claim 16, said component comprising a header, said contact means comprising plural parallel rows of parallel positioned contacts held by said body to form said header.

18. The component of claim 17, further comprising wall means between a pair of said parallel rows, and said solder strip means comprising plural solder strip means, each positioned on a row of contact means and separated from each other by said wall means.

19. An electrical component for mechanical mounting and electrical connection with respect to electrically conductive means of a printed circuit board compatibly with a surface mount process, said component comprising:

an electrically non-conducting body, plural contact means extending from said body for electrical connection with respect to such electrically conductive means, a substantially continuous solder strip extending between and at least partly surrounding at least part of a plurality of said contact means, and recess means in a surface of said body proximate locations where respective contact means extend out from said body for receiving and containing at least part of said solder strip in position with respect to said body and contact means.

20. The component of claim 19, wherein said recess means is formed by a pair of stand off protrusions protruding from said body and operative to engage at least a portion of said solder strip to retain the latter with respect to said body.

21. The component of claim 19, said recess means comprising wall means for engaging at least part of said solder strip to hold the latter with respect to said body.

22. The component of claim 21, said recess means comprising a plurality of same, each receiving and containing a respective solder strip.

23. The component of claim 22, said contact means comprising plural rows of contacts, each recess means having therein a portion of a plurality of the contacts of a respective row of contacts.

24. The component of claim 19, said component comprising a shrouded header, whereby said body comprises a base and a shroud extending therefrom, and said contact means comprises a plurality of pin type contacts.

25. An electrical component for mechanical mounting and electrical connection with respect to electrically conductive means of a printed circuit board compatibly with a surface mount process, said component comprising:

an electrically non-conducting body, plural contact means extending from said body for electrical connection with respect to such electrically conductive means, and a substantially continuous solder strip extending between and at least partly surrounding at least part of a plurality of said contact means, means integral with said component for holding said solder strip with respect to the component for retention thereon during placement with respect to a printed circuit board and during reflowing of the solder of said solder strip, and said body including plastic type material molded in place to and about at least part of each of said contact means as an integral structure.

26. The component of claim 23, said component comprising a header and said contact means comprising elongate pin type contacts extending linearly through said body in parallel relation to each other.

27. An electrical header for mechanical mounting and electrical connection with respect to electrically conductive means of a printed circuit board compatibly with a surface mount process, said header comprising:

an elongate, electrically non-conducting body, said elongate body having a pair of opposite surfaces capable of smoothly sliding across respective opposite surfaces of another header, and a groove on one of said opposite surfaces and a slot in the other of said surfaces for maintaining parallel alignment of respective headers during such sliding, plural contact means extending from said body for electrical connection with respect to such electrically conductive means, said contact means comprising elongate pin type contacts extending linearly and generally in parallel relation through said body perpendicularly to the direction of body elongation, and a substantially continuous solder strip extending between and at least partly surrounding at least part of a plurality of said contact means.

28. A method for attaching an electrical component to a printed circuit board compatibly with surface mount attaching processes, such printed circuit board having electrically conductive traces and plated through holes, such component having generally linearly extending contacts and a substantially continuous strip of solder type material extending between and at least partly surrounding at least part of a plurality of such contacts, such strip of solder material having reduced cross-sectional dimensions between respective pairs of such contacts, said method comprising:

inserting linearly extending contacts of such component through respective plated through holes while positioning such strip of solder type material in proximity to such holes, applying thermal energy to melt and re-flow such strip of solder type material generally along such contacts into such respective holes as the reduced cross sectional portions of such strip release portions of the solder strip more proximate respective adjacent contacts to prevent bridging connections where there are no contacts, providing spacing means to space such strip in spaced apart relation to such printed circuit board during said re-flowing, and allowing such solder type material to solidify to form a mechanical and electrical connection of respective contacts in respective plated through holes.

29. The method of claim 28 wherein such solder type material flows to form a meniscus along such contacts and between the latter and a surface portion of such printed circuit board.

30. An electrical component for mechanical mounting and electrical connection with respect to electrically conductive means of a printed circuit board, said component comprising:

an electrically non-conducting body, plural contact means extending from a surface of said body for electrical connection with respect to such electrically conductive means, stand off protrusion means protruding from said surface of said body defining reservoir means, and a solder strip positioned in said reservoir means and surrounding and extending between at least two of said plural contact means.

31. An electrical component according to claim 30, wherein said solder strip comprises plural link elements arranged generally in a common plane and connected by connecting means between said link elements for connecting said link elements.

* * * * *

UNITED STATES PATENT AND TRADEMARK OFFICE
CERTIFICATE OF CORRECTION

PATENT NO. : 4,884,335

DATED : December 5, 1989

INVENTOR(S) : Michael J. McCoy, et al.

It is certified that error appears in the above-identified patent and that said Letters Patent is hereby corrected as shown below:

Column 6, line 50, delete "face mount components are to be mounted".

Column 17, line 61, replace "23" with --25--.

Signed and Sealed this

Ninth Day of June, 1992

Attest:

DOUGLAS B. COMER

Attesting Officer

Acting Commissioner of Patents and Trademarks.